(12) United States Patent
Kwak

(10) Patent No.: US 12,132,068 B2
(45) Date of Patent: Oct. 29, 2024

(54) IMAGE SENSING DEVICE

(71) Applicant: SK hynix Inc., Icheon-si (KR)

(72) Inventor: Ho Young Kwak, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 393 days.

(21) Appl. No.: 17/525,207

(22) Filed: Nov. 12, 2021

(65) Prior Publication Data

US 2022/0278163 A1 Sep. 1, 2022

(30) Foreign Application Priority Data

Feb. 26, 2021 (KR) ........................ 10-2021-0026078

(51) Int. Cl.
*H01L 27/146* (2006.01)

(52) U.S. Cl.
CPC .. *H01L 27/14685* (2013.01); *H01L 27/14603* (2013.01); *H01L 27/14612* (2013.01)

(58) Field of Classification Search
CPC ......... H01L 27/14685; H01L 27/14603; H01L 27/14612; H01L 27/14609; H01L 27/14634; H01L 27/14605; H01L 27/14643; H01L 2924/12043; H01L 31/1013; H01L 31/1016; H01L 31/145–153; H01L 31/165–173; H01L 31/0256–03365; H01L 31/0304–03048; H01L 31/184–1856; H01L 31/20–208; H01L 31/02005; H01L 31/02024–0203; H01L 31/02162–02165; H04N 25/70; H04N 25/7013; H04N 25/79
See application file for complete search history.

(56) References Cited

U.S. PATENT DOCUMENTS

| 7,893,468 | B2 | 2/2011 | Gambino et al. |
| 2018/0211990 | A1* | 7/2018 | Yorikado .......... H01L 31/02327 |
| 2022/0128698 | A1* | 4/2022 | Cao ..................... G01S 7/4816 |

FOREIGN PATENT DOCUMENTS

| CN | 107425029 A | 12/2017 |
| CN | 110931517 A | 3/2020 |
| KR | 101530696 B1 | 6/2015 |
| WO | 2021016830 A1 | 2/2021 |

OTHER PUBLICATIONS

First Office Action mailed on Jun. 27, 2024 for CN Appl. No. 202111288758.6, 12 pages with English translation.

* cited by examiner

*Primary Examiner* — Mohammad A Rahman
(74) *Attorney, Agent, or Firm* — Perkins Coie LLP

(57) ABSTRACT

An image sensing device includes a first substrate layer including first conductive impurities and structured to produce photocharges based on the incident light and capture the photocharges using a voltage difference induced in response to a demodulation control signal; a second substrate layer including second conductive impurities having characteristics opposite to those of the first conductive impurities, and structured to be bonded to the first substrate layer; and a depletion layer formed between the first substrate layer and the second substrate layer.

15 Claims, 7 Drawing Sheets

IMAGE SENSING DEVICE

CROSS-REFERENCE TO RELATED APPLICATION

This patent document claims the priority and benefits of Korean patent application No. 10-2021-0026078, filed on Feb. 26, 2021, which is incorporated by reference in its entirety as part of the disclosure of this patent document.

TECHNICAL FIELD

The technology and implementations disclosed in this patent document generally relate to an image sensing device.

BACKGROUND

An image sensor is a device for capturing optical images by converting light into electrical signals using a photosensitive semiconductor material which reacts to light. With the recent development of automotive, medical, computer and communication industries, high-performance image sensors are increasingly deployed in various devices and applications such as smart phones, digital cameras, camcorders, personal communication systems (PCSs), game consoles, IoT (Internet of Things), robots, surveillance cameras, and medical micro cameras.

SUMMARY

The embodiments of the disclosed technology relate to an image sensing device with a new three-dimensional (3D) structure that includes multiple layers stacked on one another to effectively capture electrons generated in a substrate.

In one aspect, an image sensing device is provided to include a first substrate layer including first conductive impurities and structured to produce photocharges based on the incident light and capture the photocharges using a voltage difference induced in response to a demodulation control signal, a second substrate layer including second conductive impurities having characteristics opposite to those of the first conductive impurities, and structured to be bonded to the first substrate layer, and a depletion layer formed between the first substrate layer and the second substrate layer.

In another aspect, an image sensing device is provided to include a first substrate layer including first conductive impurities and structured to support one or more first photoelectric conversion regions configured to detect incident light to produce photocharges carrying image information in the incident light, the first substrate layer including a plurality of structures to produce a voltage difference induced between the plurality of structures that is indicative of the photocharges produced by the one or more first photoelectric conversion regions; a second substrate layer including second conductive impurities having characteristics opposite to those of the first conductive impurities and structured to support one or more second photoelectric conversion regions configured to detect incident light to produce, the second substrate layer including a surface facing the first substrate layer; and a depletion layer formed between the first substrate layer and the second substrate layer.

In another aspect, an image sensing device is provided to include a first epitaxial substrate including first conductive impurities; a second epitaxial substrate including second conductive impurities having characteristics opposite to those of the first conductive impurities, the second epitaxial substrate including a surface facing the first epitaxial substrate; and a depletion layer formed between the first epitaxial substrate and the second epitaxial substrate due to a junction between the first conductive impurities and the second conductive impurities.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
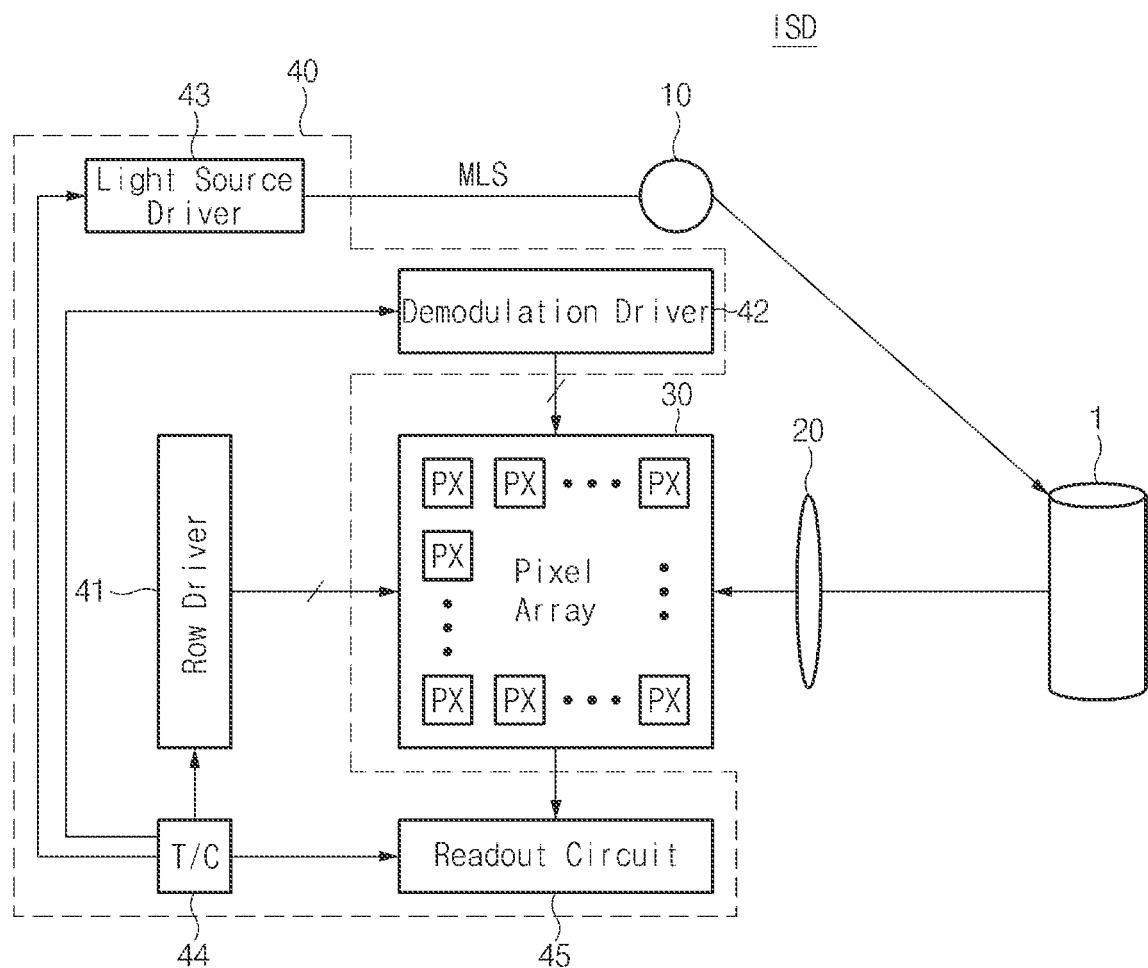
FIG. 1 is a block diagram illustrating an example of an image sensing device based on some implementations of the disclosed technology.

This patent document provides implementations and examples of an image sensing device and the disclosed features may be implemented to achieve one or more advantages in more applications. The disclosed technology can be implemented in some embodiments to provide an image sensing device with a new three-dimensional (3D) structure that includes multiple layers stacked on one another to more effectively capture electrons generated in a substrate. The disclosed technology can be implemented in some embodiments to provide an image sensing device structured to more effectively collect electrons generated in response to incident light in the substrate.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

The three-dimensional (3D) sensing is a growing research field that includes methods for acquiring the depth information by using an image sensor in various applications. In order to acquire a three-dimensional (3D) image, an image sensor obtains color information of the 3D image and the distance (or depth) between a target object and the image sensor.

Example of the 3D sensing include a triangulation method and a time of flight (TOF) method. The TOF method is being widely used because of its wide range of applications, a high processing speed, and a cost efficiency. In some implementations, the TOF method measures a distance using light emitted from the light source and light reflected from the object. The TOF method may be classified into two different types, a direct method and an indirect method, depending on whether a round-trip time or a phase difference of light is used to determine the distance between the TOF sensor and an object. The direct method may calculate a round trip time using emitted light and reflected light and measure the distance between the TOF sensor and a target object (i.e., depth) using the round-trip time. The indirect method may measure the distance between the TOF sensor and the target object using a phase difference. The direct method is used to measure a longer distance and thus is widely used in automobiles. The indirect method is used to measure a shorter distance and thus is used for a game machine or a mobile camera that is used at a shorter distance and requires a faster processing speed. The indirect TOF sensor can be implemented using a simple circuit at a low cost.

In some implementations, the indirect TOF sensor may utilize a current-assisted photonic demodulator (CAPD) structure for detecting electrons that have been generated in a substrate using a hole current acquired by applying a voltage to the substrate, such that the CAPD structure can more quickly detect electrons. In addition, the CAPD can detect electrons formed at a deep depth in the substrate.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the indirect Time of Flight (TOF) method. The TOF method based on some implementations may be a direct TOF method and an indirect TOF method. The indirect TOF method may measure the distance between the image sensing device ISD and the target object 1 by emitting modulated light to the target object 1, sensing light reflected from the target object 1, and calculating a phase difference between the modulated light and the reflected light.

The image sensing device ISD may include a light source 10, a lens module 20, a pixel array 30, and a control block 40.

The light source 10 may emit light to a target object 1 upon receiving a modulated light signal (MLS) from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Although FIG. 1 shows only one light source 10 for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixels (PXs) may be formed over a semiconductor substrate. Each unit pixel (PX) may convert incident light received through the lens module 20 into an electrical signal corresponding to the amount of incident light rays, and may thus output a pixel signal using the electrical signal. In this case, the pixel signal may be a signal indicating the distance to the target object 1. For example, each unit pixel (PX) may be a Current-Assisted Photonic Demodulator (CAPD) pixel for capturing photocharges generated in a semiconductor substrate by incident light using a difference between potential levels of an electric field. The semiconductor substrate of the unit pixel (PX) may include a stacked structure of epitaxial layers including impurities of opposite conductivity types. For example, the semiconductor substrate of the unit pixel (PX) may include a three-dimensional (3D) stacked structure in which an epitaxial layer (P-epi layer) including first conductive impurities (e.g., P-type impurities) and an epitaxial layer (N-epi layer) including second conductive impurities (e.g., N-type impurities) are bonded to form a junction surface, such that a depletion layer is then formed around the junction surface. The structure and operations of each unit pixel (PX) will hereinafter be described with reference to the drawings from FIG. 2.

The control block 40 may emit light to the target object 1 by controlling the light source 10. Upon receipt of the reflected light from the target object 1, the control block 40 may process each pixel signal corresponding to light reflected from the target object 1 by driving unit pixels (PXs) of the pixel array 30 and measure the distance between the image sensing device ISD and the surface of the target object 1 based on the pixel signal.

The control block 40 may include a row driver 41, a demodulation driver 42, a light source driver 43, a timing controller (T/C) 44, and a readout circuit 45.

In some implementations, the image sensing device ISD may include a control circuit such as the row driver 41 and the demodulation driver 42.

The control circuit may drive unit pixels (PXs) of the pixel array 30 in response to a timing signal generated from the timing controller 44.

The control circuit may generate a control signal that is used to select and control at least one row from among the plurality of rows in the pixel array 30. In some implementations, the control signal may include a demodulation control signal for generating a pixel current in the substrate, a reset signal for controlling a reset transistor, a transmission signal for controlling transmission of photocharges accumulated in a detection node, a floating diffusion signal for providing additional electrostatic capacity at a high illuminance level, a selection signal for controlling a selection transistor. The pixel current may include a current for moving photocharges generated by the substrate to the detection node.

In this case, the row driver 41 may generate a reset signal, a transmission signal, a floating diffusion signal, and a selection signal, and the demodulation driver 42 may generate a demodulation control signal. Although the row driver 41 and the demodulation driver 42 based on some implementations of the disclosed technology are configured independently of each other, the row driver 41 and the demodulation driver 42 based on some other implementations may be implemented as one constituent element that can be disposed at one side of the pixel array 30 as needed.

The light source driver 43 may generate a modulated light signal MLS capable of driving the light source 10 in response to a control signal from the timing controller 44. The modulated light signal MLS may be a signal that is modulated by a predetermined frequency.

The timing controller 44 may generate a timing signal to control the row driver 41, the demodulation driver 42, the light source driver 43, and the readout circuit 45.

The readout circuit 45 may process pixel signals received from the pixel array 30 under control of the timing controller 44, and may thus generate pixel data formed in a digital signal shape. To this end, the readout circuit 45 may include a correlated double sampler (CDS) circuit for performing correlated double sampling (CDS) on the pixel signals generated from the pixel array 30. In addition, the readout circuit 45 may include an analog-to-digital converter (ADC) for converting output signals of the CDS circuit into digital signals. In addition, the readout circuit 45 may include a buffer circuit that temporarily stores pixel data generated from the analog-to-digital converter (ADC) and outputs the pixel data under control of the timing controller 44. In the meantime, the pixel array 30 includes Current-Assisted Photonic Demodulator (CAPD) pixels. Therefore, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX). A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
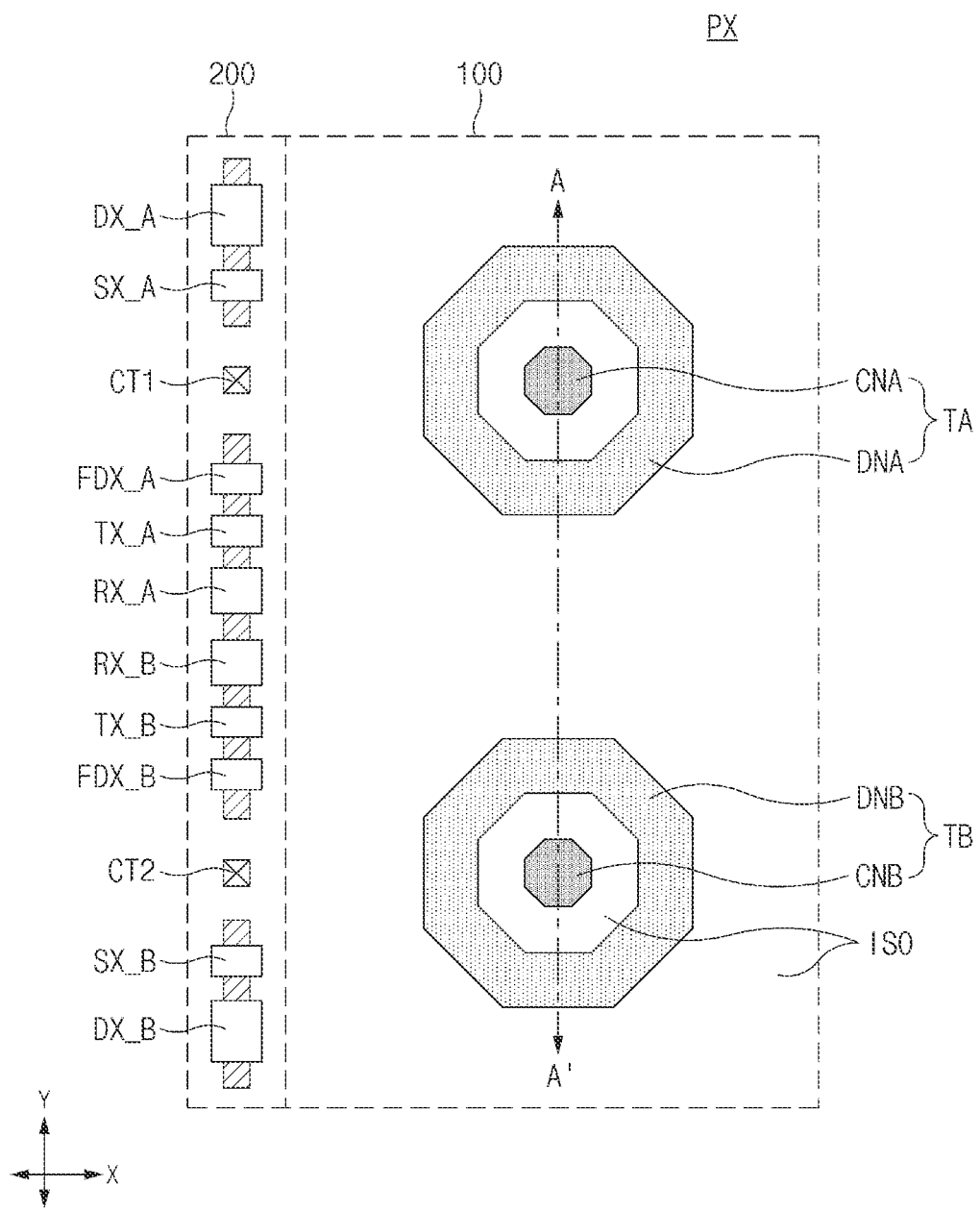
FIG. 2 is a diagram illustrating an example layout of a unit pixel included in a pixel array shown in FIG. 1 based on some implementations of the disclosed technology.

FIG. 2 is a schematic diagram illustrating an example layout of a unit pixel included in the pixel array 30 shown in FIG. 1 based on some implementations of the disclosed technology.

Referring to FIG. 2, the unit pixel PX may be any one of the plurality of pixels (PXs) shown in FIG. 1. FIG. 2 illustrates only one unit pixel PX by way of example, and thus other pixels in the pixel array 30 can have the same structure and be operated in the same way as the unit pixel PX illustrated in FIG. 2.

The unit pixel PX may include a photoelectric conversion region 100 and a pixel circuit region 200.

The photoelectric conversion region 100 may include a first tap TA (or a first demodulation node) and a second tap TB (or a second demodulation node) that are formed in a semiconductor substrate. Although FIG. 2 illustrates a unit pixel PX as including two taps TA and TB by way of example, each unit pixel PX may include more than two taps. In this case, the plurality of taps may receive the same demodulation control signal or may receive different demodulation control signals (or demodulation control signals having different time points and/or different voltage values).

Although FIG. 2 illustrates the first tap TA and the second tap TB as being arranged in a Y-axis direction (or a column direction) by way of example, the first tap TA and the second tap TB can be arranged in an X-axis direction (or a row direction) or in a diagonal direction in other implementations.

The first tap TA may include a first control node CNA and a first detection node DNA surrounding the first control node CNA. Although FIG. 2 illustrates the first control node CNA as having an octagonal shape and the first detection node DNA as being structured to surround the octagonal-shaped first control node CNA by way of example, the first control node CNA and the first detection node DNA can have different shapes from what are illustrated in FIG. 2. For instance, the first control node CNA and the first detection node DNA can have circular or polygonal shapes.

The annular-shaped first detection node DNA structured to surround the first control node CNA allows the first detection node DNA to have a large inner surface facing the first control node CNA. In this way, the first detection node DNA can more easily capture charge carriers (e.g., electrons) moving along a pixel current (e.g., hole current) formed by the first control node CNA. In other implementations, the first detection node DNA does not completely surround the first control node CNA, and may be formed in a manner that at least a portion of the inner surface of the first detection node DNA does not face the first control node CNA.

The second tap TB may include a second control node CNB and a second detection node DNB surrounding the second control node CNB. The second control node CNB and the second detection node DNB may correspond to the first control node CNA and the first detection node DNA, respectively.

The first and second control nodes CNA and CNB and the first and second detection nodes DNA and DNB may be formed in the semiconductor substrate. For example, each of the first and second control nodes CNA and CNB may be a P-type (P+) impurity region, and each of the first and second detection nodes DNA and DNB may be an N-type (N+) impurity region.

The first control node CNA and the first detection node DNA may be spaced apart from each other by a predetermined distance corresponding to the width of a device isolation layer (ISO) that is structured to physically isolate the first control node CNA from the first detection node DNA. In addition, the second control node CNB and the second detection node DNB can also be isolated from each other by the device isolation layer (ISO). The device isolation layer (ISO) may include a shallow trench isolation (STI) structure formed by filling, with insulation materials, a trench formed by etching the substrate to a predetermined depth.

The first tap TA and the second tap TB may also be spaced apart from each other by the device isolation layer (ISO).

The pixel circuit region 200 may be disposed at one side of the photoelectric conversion region 100. The pixel circuit region 200 may include a plurality of pixel transistors DX_A, SX_A, FDX_A, TX_A, RX_A, DX_B, SX_B, FDX_B, TX_B, and RX_B for generating a pixel signal corresponding to charge carriers captured by the detection nodes DNA and DNB and outputting the generated pixel signal.

The pixel transistors DX_A, SX_A, FDX_A, TX_A, and RX_A may generate a pixel signal corresponding to charge carriers captured by the first detection node DNA, and may output the pixel signal. The pixel transistors DX_A, SX_A, FDX_A, TX_A, and RX_A may be located adjacent to the first tap TA in the pixel circuit region 200.

The pixel transistors DX_B, SX_B, FDX_B, TX_B, and RX_B may generate a pixel signal corresponding to charge carriers captured by the second detection node DNB. The pixel transistors DX_B, SX_B, FDX_B, TX_B, and RX_B may be located adjacent to the second tap TB in the pixel circuit region 200.

The pixel transistors DX_A, SX_A, FDX_A, TX_A, and RX_A for the first tap TA and the pixel transistors DX_B, SX_B, FDX_B, TX_B, and RX_B for the second tap TB may be arranged symmetrical to each other as shown in FIG. 2. Contacts are structures that connect different transistors and layers to each other. In some implementations, one or more contacts for applying a bias voltage VSS to a well region may be formed between the pixel transistors SX_A and FDX_A, and one or more contacts for applying a bias voltage VSS to a well region may be formed between the pixel transistors SX_B and FDX_B.

Figure 3:
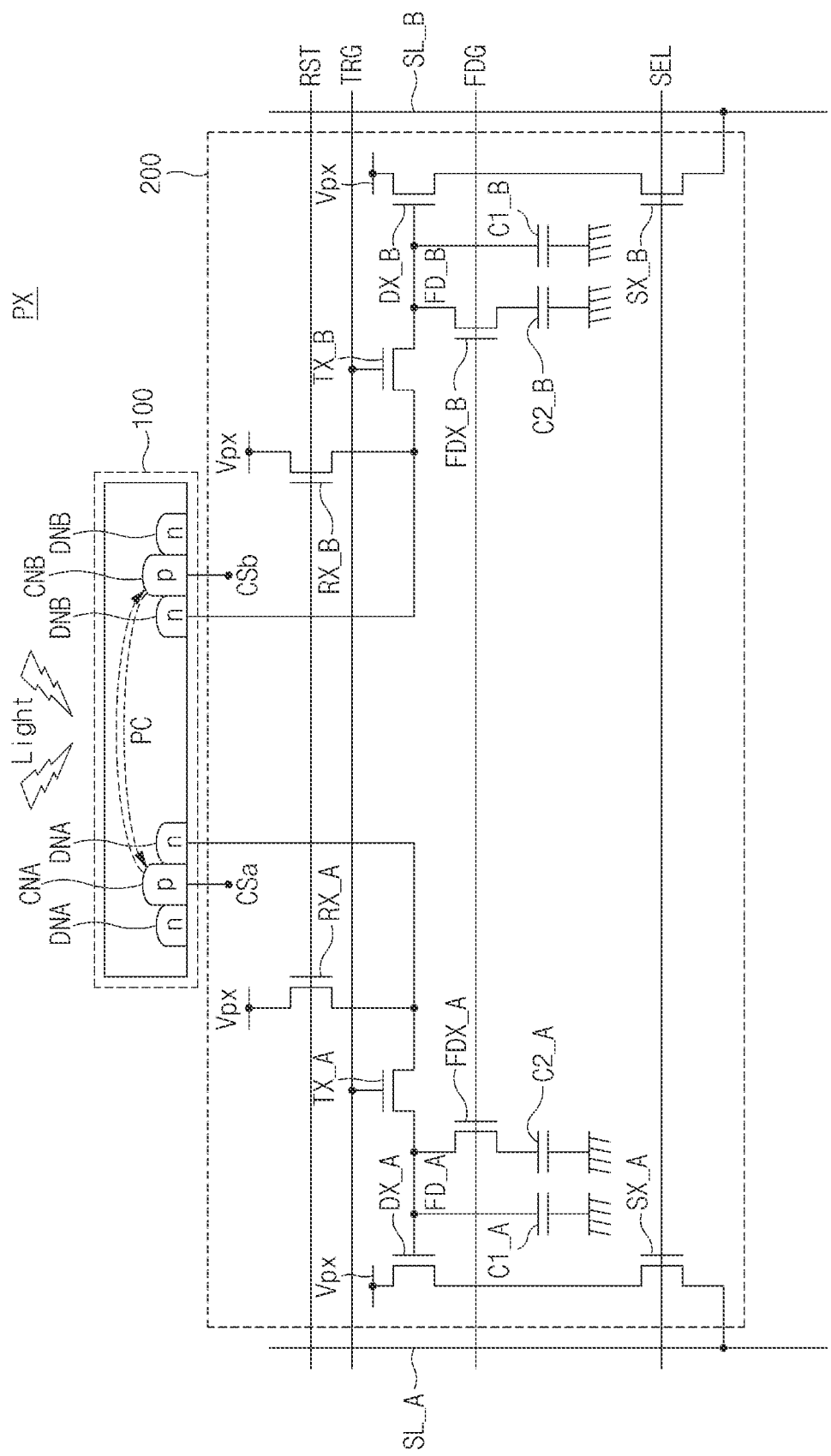
FIG. 3 is a diagram illustrating example circuitry in the unit pixel shown in FIG. 2 based on some implementations of the disclosed technology.

FIG. 3 is a diagram illustrating example circuitry of the unit pixel shown in FIG. 2 based on some implementations of the disclosed technology. In FIG. 3, the photoelectric conversion region 100 may correspond to the first tap TA and the second tap TB. The pixel circuit region 200 may correspond to the pixel transistors.

Referring to FIG. 3, the first control node CNA may receive a first demodulation control signal (CSa) from the demodulation driver 42, and the second control node CNB may receive a second demodulation control signal (CSb) from the demodulation driver 42. A voltage difference between the first demodulation control signal (CSa) and the second demodulation control signal (CSb) may generate a pixel current (PC) that can be used to control the flow of charge carriers that are generated in the substrate by incident light. For example, when the first demodulation control signal (CSa) has a higher voltage than the second demodulation control signal (CSb), the pixel current (PC) may flow from the first control node CNA to the second control node CNB. In contrast, when the first demodulation control signal (CSa) has a lower voltage than the second demodulation control signal (CSb), the pixel current (PC) may flow from the second control node CNB to the first control node CNA.

Each of the first detection node DNA and the second detection node DNB may capture charge carriers moving along the flow of the pixel current PC, and may accumulate the captured charge carriers.

The photocharges can be captured by the photoelectric conversion region 100 during a first period and a second period that are sequential time periods.

In the first period, light incident upon the substrate where the pixel PX is formed may be converted into electron-hole pairs in the substrate. In some implementations, the photocharge may include such photo-generated electrons. In some implementations, the demodulation driver 42 may output a first demodulation control signal (CSa) to the first control node CNA, and may output a second demodulation control signal (CSb) to the second control node CNB. In one example, the first demodulation control signal (CSa) may have a higher voltage than the second demodulation control signal (CSb). Here, the voltage of the first demodulation control signal (CSa) may be defined as an active voltage (or an activation voltage), and the voltage of the second demodulation control signal (CSb) may be defined as an inactive voltage (or a deactivation voltage). For example, the voltage of the first demodulation control signal (CSa) may be set to 1.2 V, and the voltage of the second demodulation control signal (CSb) may be 0 V.

A voltage difference between the first demodulation control signal (CSa) and the second demodulation control signal (CSb) may create an electric field between the first control node CNA and the second control node CNB, and thus the pixel current PC may flow from the first control node CNA to the second control node CNB. That is, holes (electron holes) in the substrate may move toward the second control node CNB, and electrons in the substrate may move toward the first control node CNA.

Electrons moving toward the first control node CNA may be captured by the first detection node DNA adjacent to the first control node CNA. Therefore, electrons in the substrate may be used as charge carriers for detecting the amount of incident light rays.

In the second period subsequent to the first period, light incident upon the pixel PX may be converted into electron-hole pairs corresponding to the amount of incident light rays (i.e., intensity of incident light). In this case, the demodulation driver 42 may output the first demodulation control signal (CSa) to the first control node CNA, and may output the second demodulation control signal (CSb) to the second control node CNB. Here, the first demodulation control signal (CSa) may have a lower voltage than the second demodulation control signal (CSb). In one example, the voltage of the first demodulation control signal (CSa) may be defined as an inactive voltage or deactivation voltage, and the voltage of the second demodulation control signal (CSb) may be defined as an active voltage or activation voltage. For example, the voltage of the first demodulation control signal (CSa) may be 0 V, and the voltage of the second demodulation control signal (CSb) may be set to 1.2 V.

A voltage difference between the first demodulation control signal (CSa) and the second demodulation control signal (CSb) may create an electric field between the first control node CNA and the second control node CNB, and the pixel current PC may flow from the second control node CNB to the first control node CNA. That is, holes (electron holes) in the substrate may move toward the first control node CNA, and electrons in the substrate may move toward the second control node CNB.

Electrons moving toward the second control node CNB may be captured by the second detection node DNB adjacent to the second control node CNB. Therefore, electrons in the substrate may be used as charge carriers for detecting the amount of incident light rays or the intensity of incident light.

In some implementations, the sequence of the first and second periods may be switched such that the first period comes after the second period.

The circuit region 200 may include a plurality of elements (pixel transistors) DX_A, SX_A, FDX_A, TX_A, RX_A, DX_B, SX_B, FDX_B, TX_B, and RX_B structured to convert photocharges captured by the first and second detection nodes DNA and DNB into electrical signals. The circuit region 200 may further include interconnects such as metal lines structured to carry electrical signals between the elements DX_A, SX_A, FDX_A, TX_A, RX_A, DX_B, SX_B, FDX_B, TX_B, and RX_B. Control signals RST, TRG, FDG, and SEL may be applied from the row driver 41 to the circuit region 200. In addition, a pixel voltage (Vpx) may be a power-supply voltage (VDD).

The photocharges captured by the first detection node DNA may be converted into electrical signals as will discussed below. The circuit region 200 may include a reset transistor RX_A, a transfer transistor TX_A, a first capacitor C1_A, a second capacitor C2_A, a floating diffusion transistor FDX_A, a drive transistor DX_A, and a selection transistor SX_A.

The reset transistor RX_A may be activated to enter an active state in response to a logic high level of the reset signal RST applied to a gate electrode thereof, such that the voltage of the floating diffusion node FD_A and the voltage of the first detection node DNA may be reset to the pixel voltage (Vpx) level. In addition, when the reset transistor RX_A is activated, the transfer transistor TX_A can also be activated to reset the floating diffusion node FD_A.

The transfer transistor TX_A may be activated (i.e., active state) in response to a logic high level of the transfer signal TRG applied to a gate electrode thereof, such that electric charge carriers accumulated in the first detection node DNA can be transmitted to the floating diffusion node FD_A.

The first capacitor C1_A may be coupled to the floating diffusion node FD_A. The second capacitor C2_A may be selectively coupled to the floating diffusion node FD_A based on the operations of the floating diffusion transistor FDX_A.

Each of the first capacitor C1_A and the second capacitor C2_A may include at least one of a metal-insulator-metal (MIM) capacitor, a metal-insulator-polysilicon (MIP) capacitor, a metal-oxide-semiconductor (MOS) capacitor, and a junction capacitor.

The floating diffusion transistor FDX_A may be activated in response to a logic high level of the floating diffusion signal FDG applied to a gate electrode thereof, such that the floating diffusion transistor FDX_A may couple the second capacitor C2_A to the floating diffusion node FD_A.

For example, the row driver 41 may turn on (or activate) the floating diffusion transistor FDX_A when the amount of incident light rays or the intensity of incident light satisfies a predetermined high illuminance condition, such that the floating diffusion transistor FDX_A enters the active state and the floating diffusion node FD_A can be coupled to the second capacitor C2_A. As a result, when the incident light is at a high illuminance level, the amount of photocharge accumulated at the floating diffusion node FD_A increases, accomplishing a high dynamic range (HDR).

On the other hand, when the incident light is at a relatively low illuminance level, the row driver 41 may turn off (or deactivate) the floating diffusion transistor FDX_A, such that the floating diffusion node FD_A can be isolated from the second capacitor C2_A.

In some other implementations, the floating diffusion transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A. A gate electrode of the drive transistor DX_A is coupled to the floating diffusion node FD_A, such that the drive transistor DX_A may operate as a source follower transistor for outputting a current (pixel signal) corresponding to potential of the floating diffusion node FD_A.

The selection transistor SX_A may be activated (i.e., active state) in response to a logic high level of the selection signal SEL applied to a gate electrode thereof, such that the pixel signal generated from the drive transistor DX_A can be output to the vertical signal line SL_A.

In order to process photocharges captured by the second detection node DNB, the circuit region 200 may include a reset transistor RX_B, a transfer transistor TX_B, a first capacitor C1_B, a second capacitor C2_B, a floating diffusion transistor FDX_B, a drive transistor DX_B, and a selection transistor SX_B. The elements for processing photocharges captured by the second detection node DNB have different timings from the elements for processing photocharges captured by the first detection node DNA. However, the elements for processing photocharges captured by the second detection node DNB may be similar or identical to the elements for processing photocharges captured by the first detection node DNA.

The pixel signal transferred from the circuit region 200 to the vertical signal line SL_A and the pixel signal transferred from the circuit region 200 to the vertical signal line SL_B may be processed using a noise cancellation technique and analog-to-digital (ADC) conversion processing to convert the pixel signals into image data.

Although each of the reset signal RST, the transmission signal TRG, the floating diffusion signal FDG, and the selection signal SEL shown in FIG. 3 is applied to the circuit region 200 through one signal line, each of the reset signal RST, the transmission signal TRG, the floating diffusion signal FDG, and the selection signal SEL can be applied to the circuit region 200 through a plurality of signal lines (e.g., two signal lines), such that elements for processing photocharges captured by the first detection node DNA and the other elements for processing photocharges captured by the second detection node DNB can operate at different timings.

The image processor (not shown) may process the image data acquired from photocharges captured by the first detection node DNA and the image data acquired from photocharges captured by the second detection node DNB, to produce a phase difference using the image data. The image processor may calculate depth information indicating the distance between the image sensor pixels and the target object 1 based on a phase difference corresponding to each pixel, and may generate a depth image including depth information corresponding to each pixel.

Figure 4:
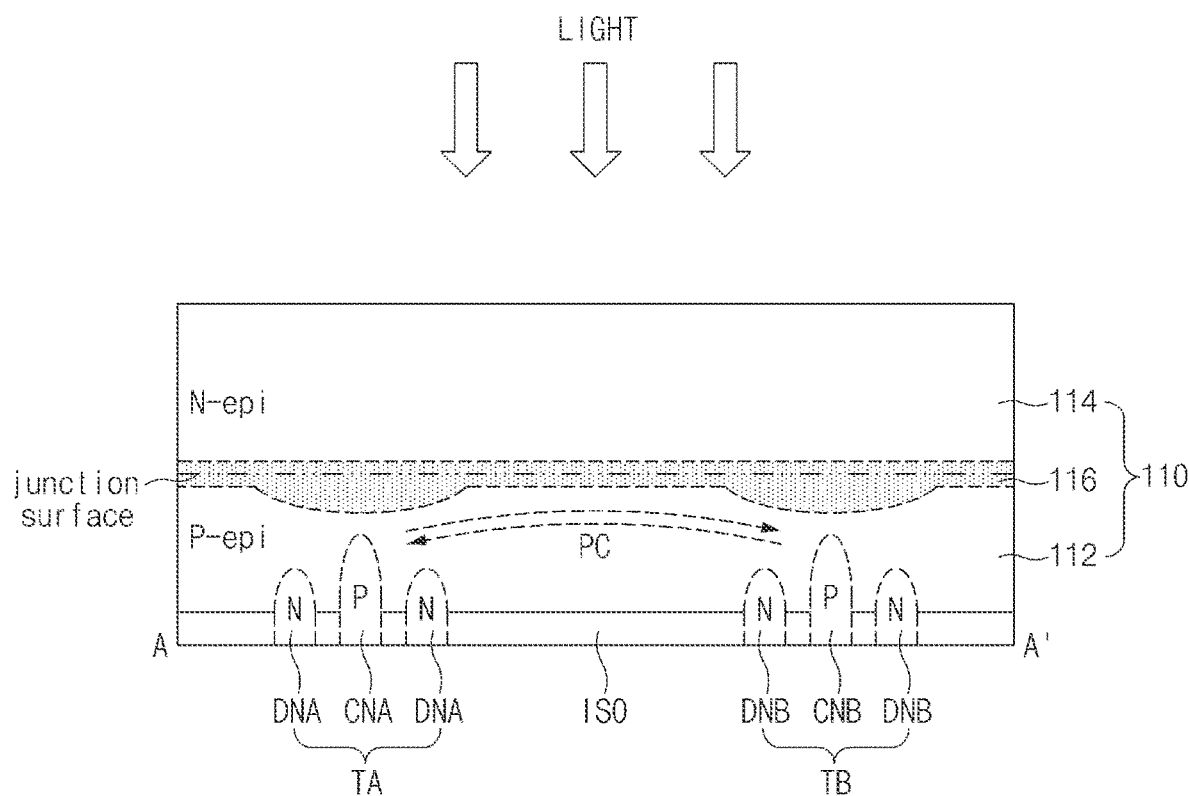
FIG. 4 is a cross-sectional view illustrating an example of the unit pixel taken along the line A-A' shown in FIG. 2 based on some implementations of the disclosed technology.

FIG. 4 is a cross-sectional view illustrating an example of the unit pixel taken along the line A-A' shown in FIG. 2 based on some implementations of the disclosed technology.

Referring to FIG. 4, a substrate layer 110 of the unit pixel (PX) may include a first substrate layer 112, a second substrate layer 114, and a depletion layer 116. An image sensing device implemented based on some embodiments of the disclosed technology may include the substrate layer 110 which includes the first substrate layer 112 and the second substrate layer 114 stacked on one another with the depletion layer 116 being formed between the first substrate layer 112 and the second substrate layer 114. Each of the first substrate layer 112 and the second substrate layer 114 may include a photoelectric conversion region structured to convert incident light into electric charge carriers.

The first substrate layer 112 may include an epitaxial layer doped with first conductive impurities (e.g., P-type impurities) having low doping concentration or density (P$^-$). The epitaxial layer may be formed by epitaxial growth.

The first substrate layer 112 may include a first surface and a second surface facing or opposite to the first surface, and may generate photocharges from incident light. In one example, the first substrate layer 112 is structured to receive incident light through the second surface. In this case, a first tap TA, a second tap TA, and a device isolation layer (ISO)

may be formed at the first surface of the first substrate layer 112. The second surface of the first substrate layer 112 may be arranged to face the second substrate layer 114. In one example, the second surface of the first substrate layer 112 may border the depletion layer 116 being formed between the first substrate layer 112 and the second substrate layer 114.

The second substrate layer 114 may include a surface that is arranged to face the second surface of the first substrate layer 112, and may include an epitaxial layer doped with second conductive impurities (e.g., N-type impurities) having low doping concentration or density (N$^-$). In some embodiments of the disclosed technology, the second conductive impurities have opposite polarity to the first conductive impurities.

Although FIG. 4 illustrates the first substrate layer 112 and the second substrate layer 114 as being a P-type epitaxial substrate and an N-type epitaxial substrate, respectively, by way of example, the first substrate layer 112 may include the N-type epitaxial substrate and the second substrate layer 114 may include the P-type epitaxial substrate in other implementations. In this way, the substrate layer 110 of the unit pixel (PX) may be formed in a three-dimensional (3D) stacked structure in which two substrate layers 112 and 114 with opposite polarities are stacked on one another.

The depletion layer 116 may be formed as a depletion layer between a P-N junction. The depletion layer 116 is formed between the first substrate layer 112 including P-type impurities and the second substrate layer 114 including N-type impurities. The depletion layer 116 may be the boundary between the first substrate layer 112 and the second substrate layer 114 that form a P-N junction. In the depletion layer 116, regions adjacent to the first tap TA and the second tap TB may extend toward the tap regions TA and TB and may be thicker than other regions. In an implementation where the tap regions TA and TB formed in the first substrate layer 112 include high-density impurities and a region between the tap regions TA and TB includes low-density impurities, regions adjacent to the high-density impurity regions TA and TB in the depletion layer 116 may extend toward the high-density impurity regions TA and TB due to a difference in density between the adjacent regions, as shown in FIG. 4.

Since the depletion layer 116 is formed in the substrate layer 110 of the unit pixel (PX) having a current-assisted photonic demodulator (CAPD) pixel structure, photocharges generated in the first substrate layer 112 may be collected in the vicinity of the depletion layer 116. In particular, some of the light beams incident upon the first substrate layer 112 that are scattered before reaching a region where a pixel current flows (e.g., a targeted photoelectric conversion region) may generate photocharges, and the generated photocharges may be collected in the extended depletion layer 116 disposed below the tap regions TA and TB.

Figure 5:
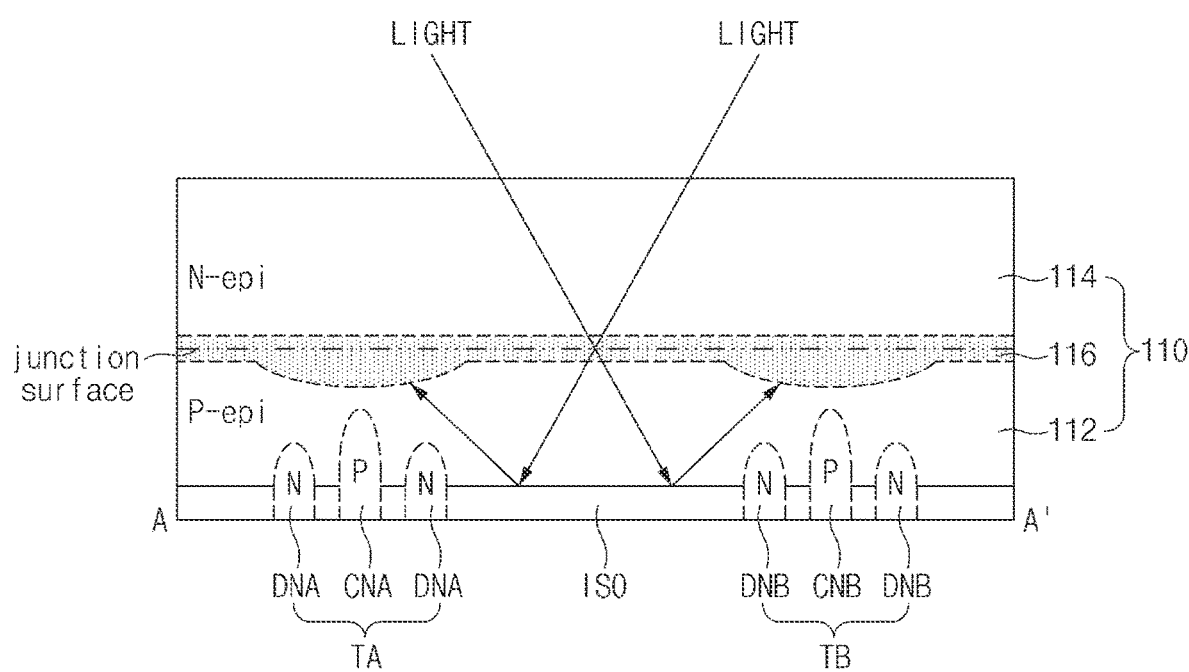
FIG. 5 is a conceptual diagram illustrating the paths of light rays scattered in a substrate based on some implementations of the disclosed technology.

For example, as shown in FIG. 5, light beams that are reflected from the first surface of the first substrate layer 112 and are converted into electrical charge carriers in a region below the tap regions TA and TB may not be easily captured by the pixel current (PC) generated by the control nodes CNA and CNB. In some implementations, the depletion layer 116 may be formed below the tap regions TA and TB such that photocharges can be collected at a region that is closer to the tap regions TA and TB. As a result, the image sensing device implemented based on some embodiments of the disclosed technology can capture more photocharges using the detection nodes DNA and DNB, resulting in an increase in light efficiency of the image sensing device.

Figure 6:
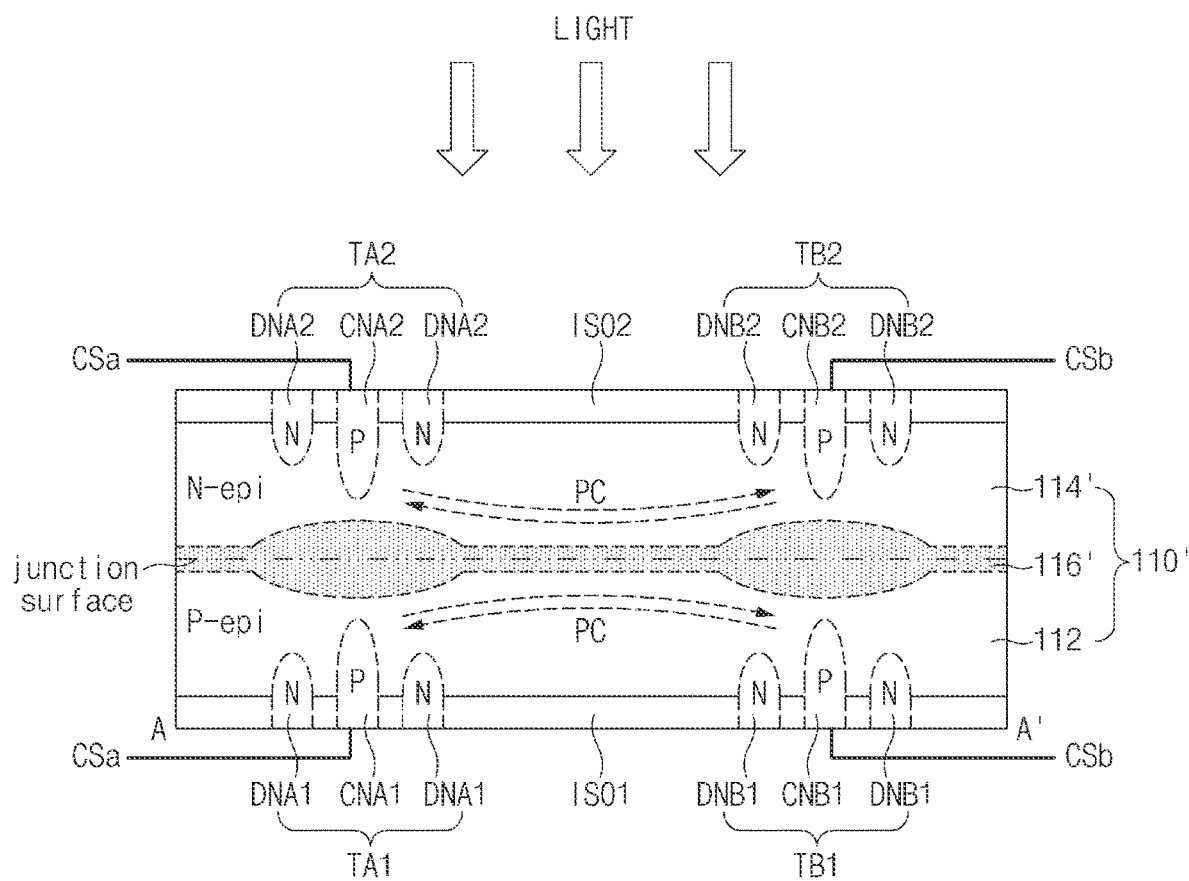
FIG. 6 is a cross-sectional view illustrating an example of the unit pixel taken along the line A-A' shown in FIG. 2 based on some implementations of the disclosed technology.
Figure 7:
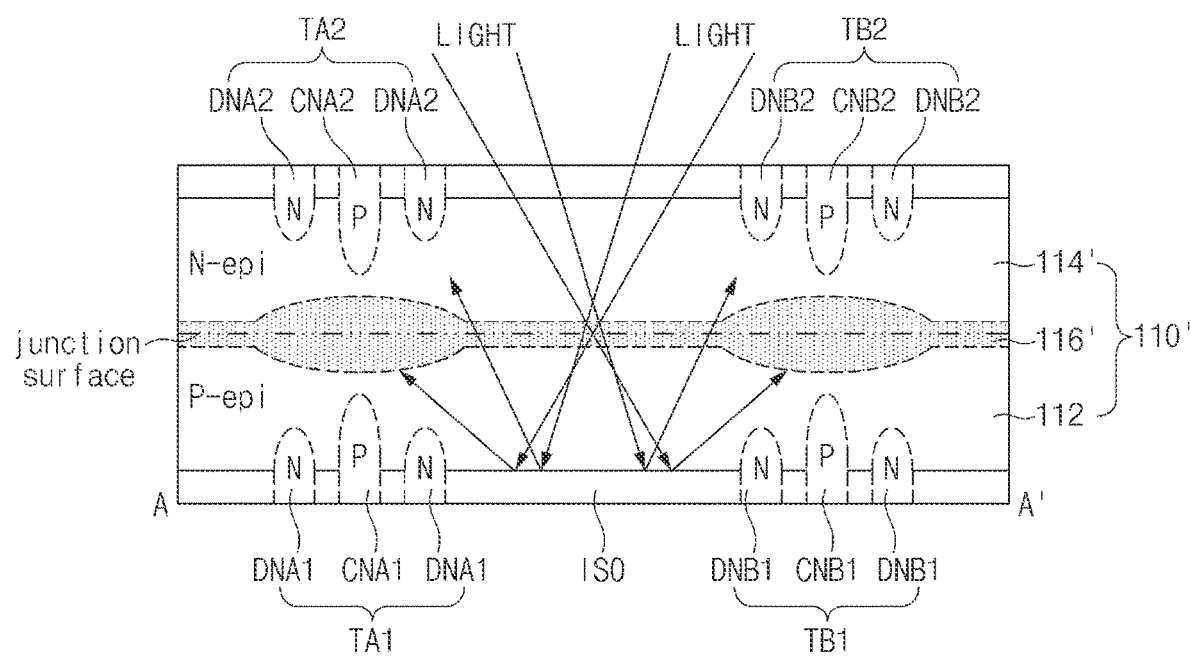
FIG. 7 is a conceptual diagram illustrating the paths of light rays scattered in a substrate based on some implementations of the disclosed technology.

FIG. 6 is a cross-sectional view illustrating an example of the unit pixel taken along the line A-A' shown in FIG. 2 based on some implementations of the disclosed technology.

Referring to FIG. 6, a substrate layer 110' of the unit pixel (PX) may include a first substrate layer 112, a second substrate layer 114', and a depletion layer 116'.

The first substrate layer 112 may include an epitaxial layer doped with first conductive impurities (e.g., P-type impurities) having low doping concentration or density (P$^-$). The first substrate layer 112 may include a first surface and a second surface facing or opposite to the first surface, and may generate photocharges from incident light. In this case, a first tap TA1, a second tap TB1, and a device isolation layer (ISO1) may be formed at the first surface of the first substrate layer 112. The second surface of the first substrate layer 112 may be arranged to face the second substrate layer 114'. In one example, the second surface of the first substrate layer 112 may border the depletion layer 116' being formed between the first substrate layer 112 and the second substrate layer 114'.

The second substrate layer 114' may include an epitaxial layer doped with low-density (N$^-$) second conductive impurities (e.g., N-type impurities) having characteristics opposite to those of the first conductive impurities (e.g., P-type impurities). Although FIG. 6 illustrates the first substrate layer 112 and the second substrate layer 114' as being a P-type epitaxial substrate and an N-type epitaxial substrate, respectively, by way of example, the first substrate layer 112 may include the N-type epitaxial substrate and the second substrate layer 114' may include the P-type epitaxial substrate in other implementations. In this way, the substrate layer 110' of the unit pixel (PX) may be formed in a three-dimensional (3D) stacked structure in which two substrate layers 112 and 114' with opposite polarities are stacked on one another.

The second substrate layer 114' may include a first surface and a second surface facing or opposite to the first surface, and may generate photocharges from incident light. In one example, the first surface of the second substrate layer 114' may be arranged to face the second surface of the first substrate layer 112. Here, a third tap TA2, a fourth tap TB2, and a device isolation layer (ISO2) may be formed at the second surface of the second substrate layer 114'.

The third tap TA2 may be formed symmetrical to the first tap TA1 with respect to the depletion layer 116', and the fourth tap TB2 may be formed symmetrical to the second tap TB1 with respect to the depletion layer 116'. The third tap TA2 may be formed to have the same structure as the first tap TA1, and the fourth tap TB2 may be formed to have the same structure as the second tap TB1. For example, the third tap TA2 may include a third control node CNA2 and a third detection node DNA2 surrounding the third control node CNA2, and the fourth tap TB2 may include a fourth control node CNB2 and a fourth detection node DNB2 surrounding the fourth control node CNB2. In addition, the third tap TA2 may perform the same function as the first tap TA1, and the fourth tap TB2 may perform the same function as the second tap TB1. For example, the third tap TA2 and the fourth tap TB2 may generate the pixel current (PC) in the second substrate layer 114' based on demodulation control signals applied to the third control node CNA2 and the fourth control node CNB2 to control the movement of photocharges and capture the photocharges using the third detection node DNA2 and the fourth detection node DNB2.

The control node CNA1 of the first tap TA1 and the control node CNA2 of the third tap TA2 may be coupled to the demodulation driver 42 in common, so that the control node CNA1 of the first tap TA1 and the control node CNA2 of the third tap TA2 can simultaneously receive the same first demodulation control signal (CSa). The control node CNB1 of the second tap TB1 and the control node CNB2 of the fourth tap TB2 may be coupled to the demodulation driver 42 in common, so that the control node CNB1 of the second tap TB1 and the control node CNB2 of the fourth tap TB2 can simultaneously receive the same second demodulation control signal (CSb).

The detection node DNA1 of the first tap TA1 and the detection node DNA2 of the third tap TA2 may be coupled to the transfer transistor (TX_A) and the reset transistor (RX_A) of the circuit region 200 in common. The detection node DNB1 of the second tap TB1 and the detection node DNB2 of the fourth tap TB2 may be coupled to the transfer transistor (TX_B) and the reset transistor (RX_B) of the circuit region 200 in common.

The depletion layer 116' may be formed as a depletion layer between a P-N junction. The depletion layer 116' is formed between the first and second substrate layers 112 and 114' including impurities of opposite polarities, such that the depletion layer 116' may be formed in the vicinity of the PN junction surface. In the depletion layer 116', regions adjacent to the tap regions TA1, TA2, TB1, and TB2 may extend toward the tap regions TA1, TA2, TB1, and TB2 and may be thicker than other regions. For example, assuming that the tap regions TA1, TA2, TB1, and TB2 include higher-density impurities than a region disposed between the tap regions TA1, TA2, TB1, and TB2, a region located between the tap regions TA1 and TA2 in the depletion layer 116' and a region located between the tap regions TB1 and TB2 in the depletion layer 116' may extend toward the tap regions TA1, TA2, TB1, and TB2, as shown in FIG. 6.

Although FIG. 4 only illustrates photocharges that are generated in the first substrate layer 112 to be efficiently captured by way of example, some of the scattered light beams may reach the second substrate layer 114' and be converted into electric charge carriers.

As described above, photocharges generated in the second substrate layer 114' can be captured by the third tap TA2 and the fourth tap TB2. In addition, even in the second substrate layer 114', the depletion layer 116' disposed below the third tap TA2 and the fourth tap TB2 may be formed to extend toward the third tap TA2 and the fourth tap TB2, such that photocharges generated in the second substrate layer 114' can be effectively captured by the detection nodes DNA2 and DNB2.

In light of the above description, the image sensing device based on some implementations of the disclosed technology can more effectively collect electrons generated in response to incident light in the substrate.

Although a number of illustrative embodiments have been described, it should be understood that variations and modifications of the disclosed embodiments and other embodiments can be devised based on what is described and/or illustrated in this patent document.

What is claimed is:

1. An image sensing device comprising:
a first substrate layer including first conductive impurities and structured to produce photocharges based on incident light and capture the photocharges using a voltage difference induced in response to a demodulation control signal;
a second substrate layer including second conductive impurities having characteristics opposite to those of the first conductive impurities, and structured to be bonded to the first substrate layer; and
a depletion layer formed between the first substrate layer and the second substrate layer,
wherein the first substrate layer includes a plurality of first substrate layer taps, and
wherein the plurality of first substrate layer taps includes:
a first control node and a second control node spaced apart from each other by a predetermined distance and configured to generate a pixel current in the first substrate layer based on the demodulation control signal;
a first detection node formed to surround the first control node; and
a second detection node formed to surround the second control node.

2. The image sensing device according to claim 1, wherein
the plurality of first substrate layer taps controls movement of photocharges by generating a pixel current in the first substrate layer using the voltage difference and captures moving photocharges.

3. The image sensing device according to claim 1, wherein
the first control node and the second control node generate a pixel current in the first substrate layer based on the demodulation control signal;
the first detection node captures the photocharges moving toward the first control node by the pixel current; and
the second detection node captures the photocharges moving toward the second control node by the pixel current.

4. The image sensing device according to claim 1, wherein:
the depletion layer includes one or more depletion regions adjacent to the plurality of first substrate layer taps and formed to extend toward the plurality of first substrate layer taps.

5. The image sensing device according to claim 1, wherein the second substrate layer generates photocharges converted from the incident light, and includes a plurality of second substrate layer taps configured to control movement of the photocharges by generating a pixel current in the second substrate layer using a voltage difference induced in response to the demodulation control signal and capture moving photocharges.

6. The image sensing device according to claim 5, wherein the plurality of second substrate layer taps includes:
a third control node and a fourth control node spaced apart from each other by a predetermined distance, and configured to generate the pixel current in the second substrate layer based on the demodulation control signal;
a third detection node formed to surround the third control node, and capture the photocharges moving toward the third control node by the pixel current; and
a fourth detection node formed to surround the fourth control node, and capture the photocharges moving toward the fourth control node by the pixel current.

7. The image sensing device according to claim 5, wherein:
the depletion layer includes one or more depletion regions disposed between the plurality of first substrate layer taps and the plurality of second substrate layer taps and formed to extend toward the plurality of first substrate layer taps and the plurality of second substrate layer taps.

8. The image sensing device according to claim 5, wherein:

the plurality of first substrate layer taps and the plurality of second substrate layer taps are arranged symmetrical to each other with respect to the depletion layer.

9. The image sensing device according to claim 1, wherein:
the depletion layer is formed between the first conductive impurities and the second conductive impurities.

10. The image sensing device according to claim 1, wherein:
each of the first substrate layer and the second substrate layer is an epitaxial layer formed by epitaxial growth.

11. An image sensing device comprising:
a first epitaxial substrate including first conductive impurities;
a second epitaxial substrate including second conductive impurities having characteristics opposite to those of the first conductive impurities, the second epitaxial substrate including a surface facing the first epitaxial substrate; and
a depletion layer formed between the first epitaxial substrate and the second epitaxial substrate due to a junction between the first conductive impurities and the second conductive impurities,
wherein the first epitaxial substrate includes a plurality of first taps, and
wherein the plurality of first taps includes:
a first control node and a second control node spaced apart from each other by a predetermined distance;
a first detection node formed to surround the first control node; and
a second detection node formed to surround the second control node.

12. The image sensing device according to claim 11, wherein
the plurality of first taps controls movement of photocharges by generating a pixel current in the first epitaxial substrate using a voltage difference induced between the plurality of taps in response to a demodulation control signal and captures moving photocharges.

13. The image sensing device according to claim 11, wherein:
the depletion layer includes one or more depletion regions adjacent to the plurality of first taps and formed to extend toward a corresponding first tap.

14. The image sensing device according to claim 11, wherein the second epitaxial substrate includes:
a plurality of second taps configured to control movement of photocharges by generating a pixel current using a voltage difference induced between the plurality of taps in response to a demodulation control signal, and capture moving photocharges.

15. The image sensing device according to claim 14, wherein:
the depletion layer includes a depletion region disposed between the plurality of first taps and the plurality of second taps and formed to extend toward the plurality of first taps and the plurality of second taps.

* * * * *